United States Patent [19]

Haj-Ali-Ahmadi et al.

[11] Patent Number: 5,053,853

[45] Date of Patent: Oct. 1, 1991

[54] MODULAR ELECTRONIC PACKAGING SYSTEM

[75] Inventors: Javad Haj-Ali-Ahmadi; Richard F. Frankeny; Karl Hermann, all of Austin, Tex.

[73] Assignee: International Business Machines Corporation, Armonk, N.Y.

[21] Appl. No.: 520,439

[22] Filed: May 8, 1990

[51] Int. Cl.$^5$ .................. H02B 1/00; H01L 23/02; H01L 25/04

[52] U.S. Cl. .................. 357/74; 357/81; 357/82; 361/382; 361/385

[58] Field of Search .............. 357/74, 82; 351/75; 361/380, 381, 382, 383, 384, 385, 386, 387, 388, 389

[56] References Cited

U.S. PATENT DOCUMENTS

| | | | |
|---|---|---|---|
| 3,676,753 | 7/1972 | Norman, Sr. | 357/75 |
| 4,531,146 | 7/1985 | Cutchaw | 357/82 |
| 4,612,978 | 9/1986 | Cutchaw | 357/82 |
| 4,884,169 | 11/1989 | Cutchaw | 357/82 |

Primary Examiner—Jerome Jackson, Jr.
Assistant Examiner—Carl Whitehead, Jr.
Attorney, Agent, or Firm—Robert M. Carwell; Mark E. McBurney

[57] ABSTRACT

An electronic circuit packaging module includes a lower substrate, an upper cooling unit, and a frame disposed between the substrate and cooling unit. The substrate carries a plurality of integrated circuit chips with lead-outs to a plurality of downwardly protruding dimpled contact points disposed about the substrate periphery. The frame includes a plurality of insulative inserts about its periphery having conductive pins each with a lower extension extending below the insert and an upper contact point recessed within the insert. The cooling unit includes a plurality of fluid bags each in contact with a respective chip on the substrate for thermal management. A plurality of such modules are stacked in vertical registry with each downwardly protruding dimple of a module extending into a respective insert recess of an adjacent module. Electrical contact is thus effected between the respective dimples on the lower surface of the upper module and respective upper contact points of the recessed pins on the upper surface of the cover module. The lower extension of the pins of each insert of a given module thus extend into contact with the upper surface of a respective dimple of an adjacent lower module. In this manner, vertical electrical interconnection is established through the pins when mated in vertical registry, establishing a plurality of conductive paths in the Z axis.

16 Claims, 4 Drawing Sheets

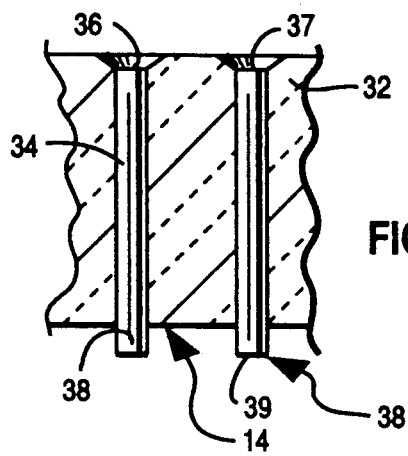
FIG. 6
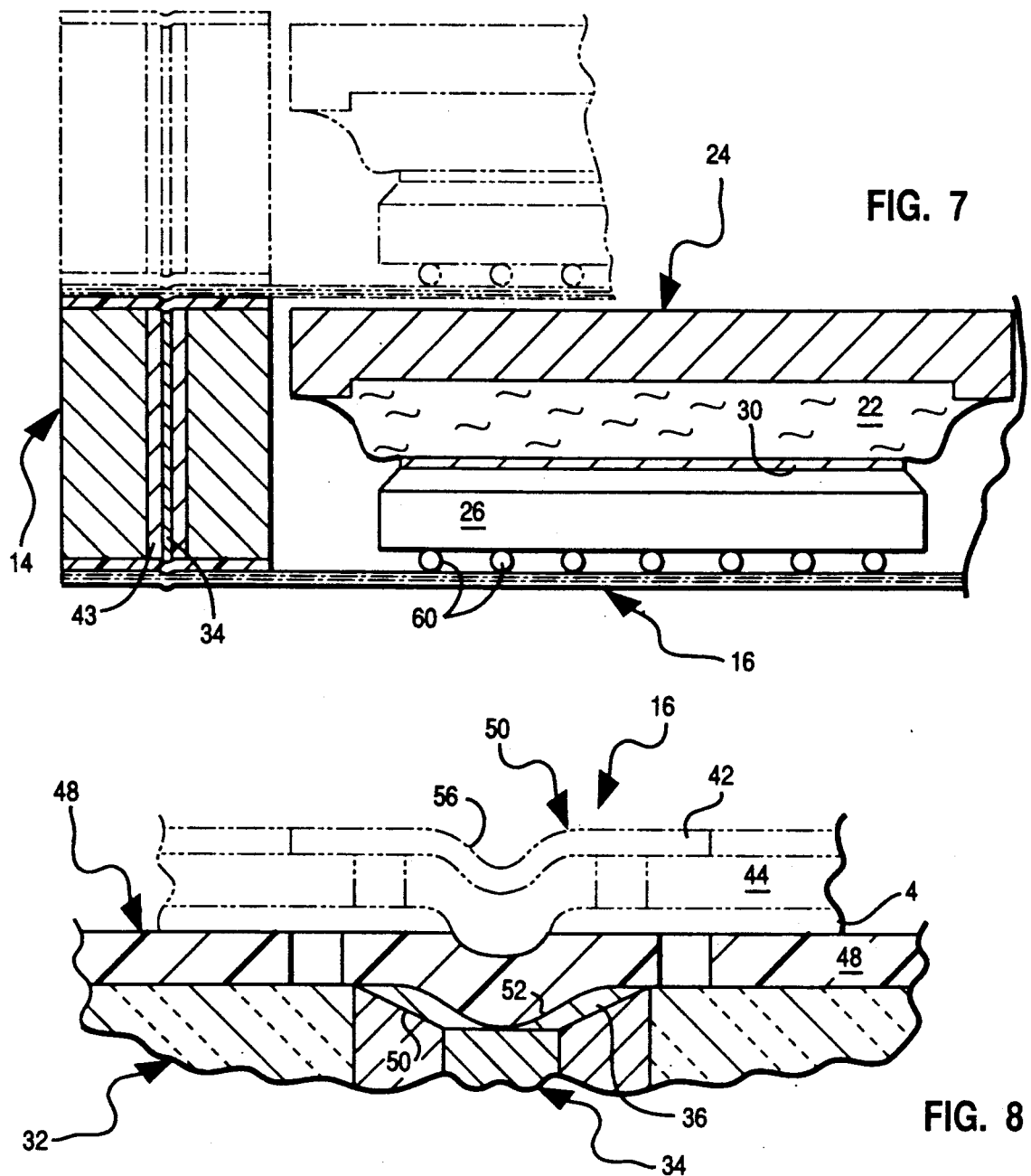
FIG. 7
FIG. 8

MODULAR ELECTRONIC PACKAGING SYSTEM

TECHNICAL FIELD

This invention relates to electronic circuit packaging and, more particularly, relates to systems for forming multi-layered circuit interconnections in the vertical and horizontal planes.

BACKGROUND ART

Currently, the predominant packaging approach is two dimensional wherein components are placed on a carrier and electrical intercommunication occurs only in the X-Y plane. A common example of this may be found in the conventional tape automated bonding or "TAB" type packaging systems well known in the art.

While such TAB packaging illustrates the evolution of electronic packaging art into increasingly higher density packages, practical limits to the degree of miniaturization possible in the X-Y plane arose thereby constraining improvements in packaging density. This was due, for example, to finite limitations which could practically be achieved in conductive line pitches which could be etched or otherwise established on planar substrates. Moreover, and perhaps more problematical, was the fact that many components often needed to be located proximally to one-another, which is an inherent limitation of X-Y planar component positioning.

Accordingly, with manufacturing and packaging technology reaching practical limits in one plane, attention began to focus in the development of the art on ways to increase density through use of the vertical or Z axis direction. Thus, these considerations gave rise to numerous elaborate schemes for providing vertical "sandwiches" of components, circuits and even stacked pluralities of electrically interconnected horizontal boards. However, several problems were associated with these attempts to extend the packaging art.

First, by providing multi-layered packaging, thermal management problems surfaced which were destructive of the circuits being vertically stacked upon one another. Heat generated by a given package would naturally rise thereby affecting adjacent packages attempting to stack multiple packages vertically, the problem of thermal destruction was compounded.

Moreover, as may be seen by review of illustrative attempts to capitalize on space available in the Z axis direction, elaborate, expensive and often unreliable interconnecting schemes, including mechanical connectors and the like, were devised for effecting vertical conductive paths as required and desired. Not only were these connecting schemes unreliable, but often they created extremely difficult problems in terms of manufacturing and assembly.

For these and other reasons, a modular packaging system was highly desired which was simple to construct, provided extremely high-density interconnect capability, was flexible in terms of varying degrees of package density which could be accommodated, avoided the necessity for complicated mechanical interconnections, and, at the same time, provided a solution to the aforementioned thermal management problems. These and other benefits of the present invention are provided.

SUMMARY OF THE INVENTION

An electronic circuit packaging module includes a lower substrate, an upper cooling unit and a frame disposed therebetween. The substrate carries a plurality of integrated circuit chips with lead-outs to a plurality of downwardly protruding dimpled contact points disposed about the substrate periphery. The frame includes a plurality of insulative inserts about its periphery having conductive pins each with a lower extension extending below the insert and an upper contact point recessed within the insert. The cooling unit includes a plurality of fluid bags each in contact with a respective chip on the substrate for thermal management. A plurality of such modules are stacked in vertical registry whereby each downwardly protruding dimple of a module extends into a respective insert recess of an adjacent module therebelow. Electrical contact is thus effected between the respective dimples on the lower surface of the upper module and respective upper contact points of the recessed pins on the upper surface of the cover module. The lower extension of the pins of each insert of a given module thus extend into contact with the upper surface of a respective dimple of an adjacent lower module. In this manner, vertical electrical interconnection is established through the pins when mated in vertical registry, establishing a plurality of conductive paths in the Z axis. Electrical interconnection between any such vertical path and horizontal locations on a given substrate are effected by means of the electrical junction formed by a dimple of an upper module in contact with the upper recessed pin contact point of the adjacent lower module. Multiple vertical conductive paths are established spanning a multiplicity of substrates while simultaneously effecting any desired electrical connection between a given vertical path and any location on a given substrate within a particular module.

BRIEF DESCRIPTION OF THE DRAWING

The novel features believed to be characteristic of the invention are set forth in the appended claims. The invention itself, however, as well as other features and advantages thereof, will be best understood by reference to the following description of the preferred embodiment, when read in conjunction with the accompanying figures, wherein:

FIG. 6 is a partial sectional view of the insert of FIG. 3.

FIG. 7 is a sectional view of a portion of the module 10 of FIG. 2 taken along line 7—7.

FIG. 8 is a detailed view of a portion of the module of FIG. 7 illustrating the electrical interconnection between the substrate dimples and the pins of the insert.

BEST MODE FOR CARRYING OUT THE INVENTION

Figure 1:
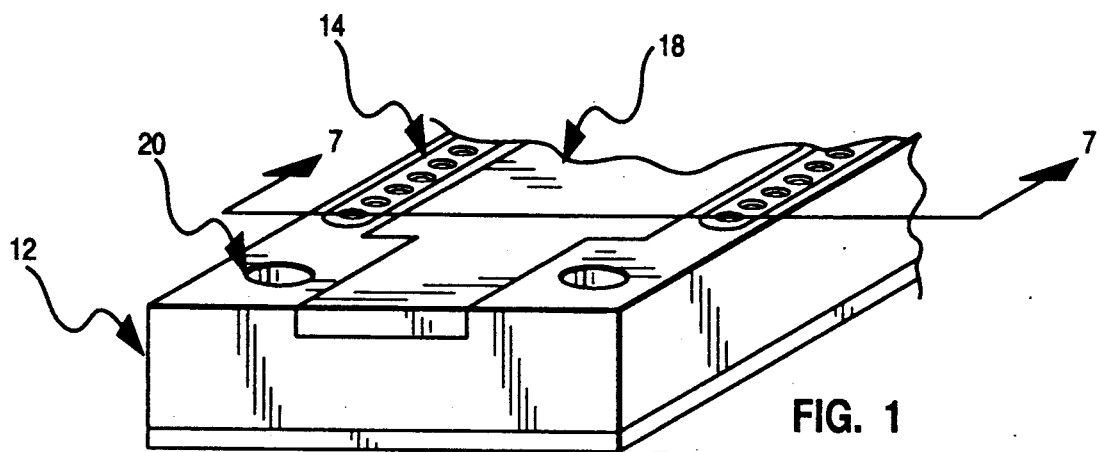
FIG. 1 is a partial pictorial view of one embodiment of a circuit package module of the present invention.

Referring first to FIG. 1, a circuit package module 10 of the present invention is pictorially depicted therein.

The module 10 is broadly comprised of a metallic frame 12, a plurality of inserts 14 pressed into the frame 12 about the periphery thereof, a cooling unit 18 and a substrate 16.

Figure 2:
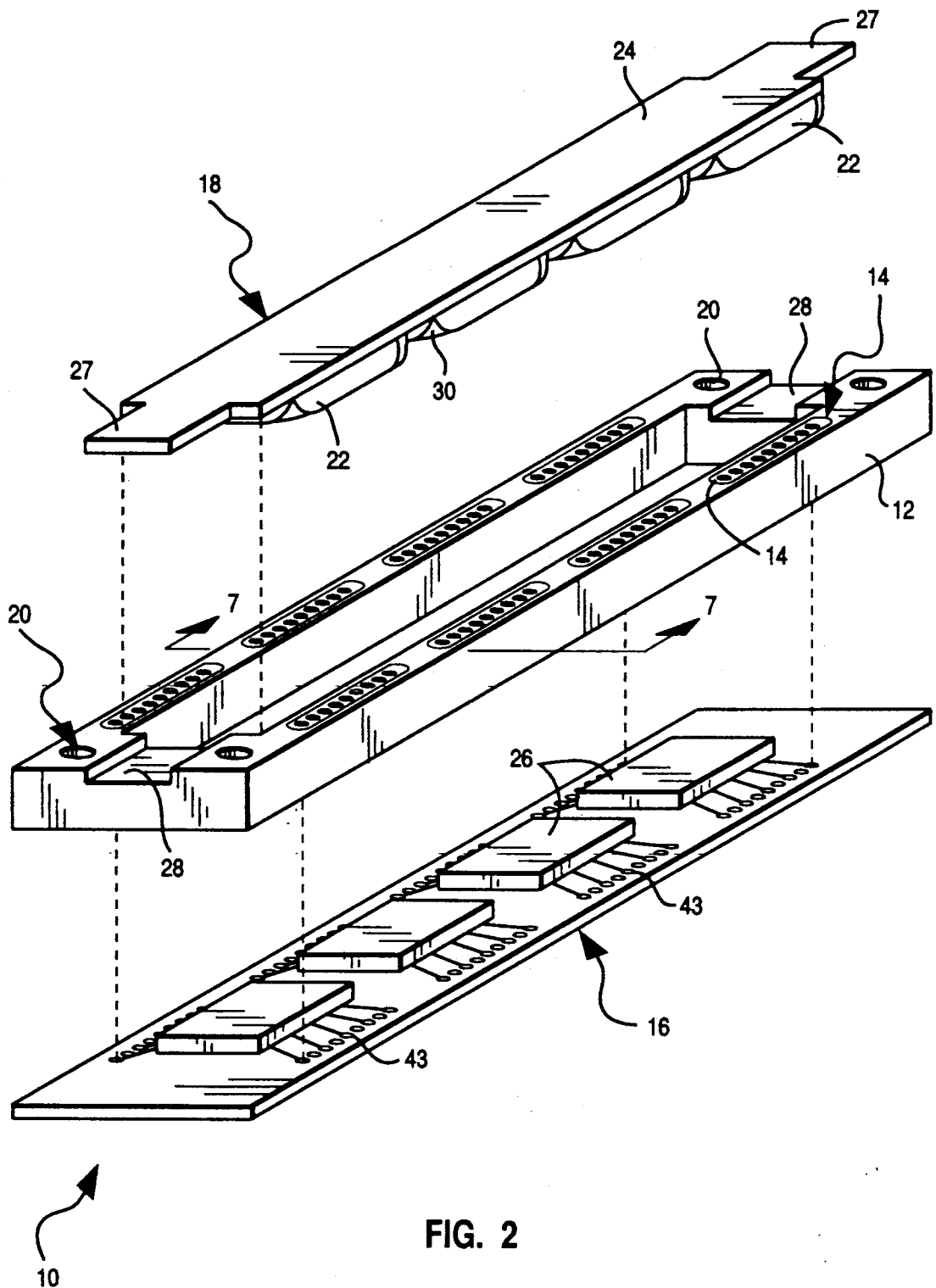
FIG. 2 is a pictorial view of a module of FIG. 1 in its entirety shown in an exploded view.

Referring now to FIG. 2, depicted therein is a pictorial view of the packaging module 10 of FIG. 1 in exploded form wherein the more detailed features of the frame 12, cooling unit 18 and substrate 16 may be readily seen. The frame 12 includes a plurality of these inserts 14 which serve the purpose of establishing a plurality of vertical vias for purposes to be hereinafter described. At opposing ends of the frame 12, slots 28 are provided to receive mating tongues 26 of the cooling frame 24 which comprises a portion of the cooling unit 18. The frame 24 has an outer geometry designed so as to matingly engage a corresponding opening formed in the upper portion of the frame 12.

Figure 9:
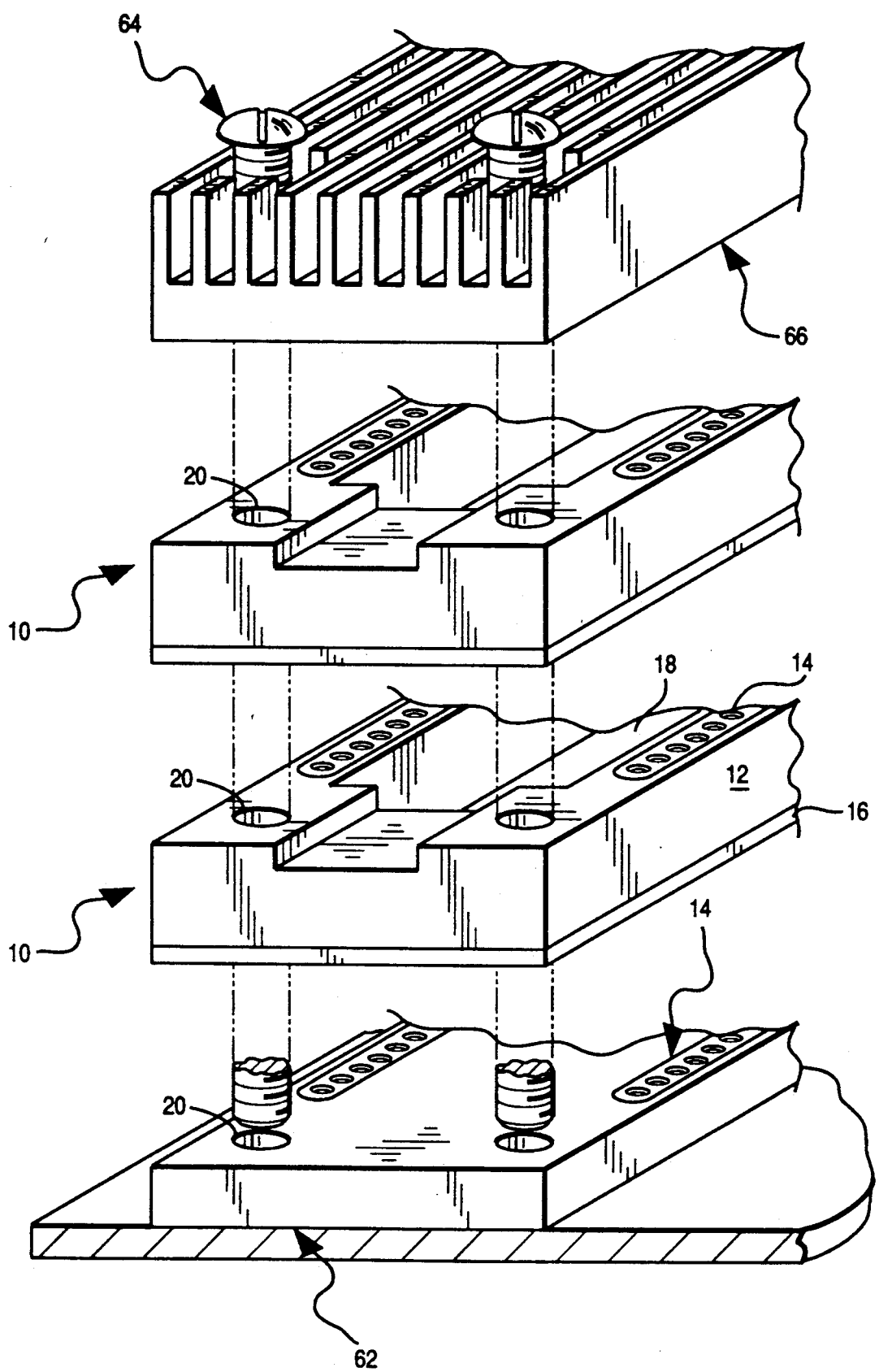
FIG. 9 is a pictorial view of a packaging system of the present invention, partly in section, comprising a plurality of the modules of FIG. 1, a printed carrier and heat sink.

The cooling frame 24 is a rigid member consisting of a heat conductive metal and supports a plurality of fluid bags 22 interconnected and disposed so as to match to corresponding locations of chips 26 on the substrate 16. A plurality of holes 20 are disposed vertically through the frame 12 for purposes of facilitating interconnection of a plurality of such package modules 10 in accordance with the present invention as shown in FIG. 9. In an alternative embodiment wherein thermal management is critical, conduction of heat away from the chips 26 may be further enhanced by circulation of externally cooled fluids through the fluid bags 22. In this case, appropriate plumbing circuits may be provided in the frame 12, or the like, for effecting the desired fluid flow through the fluid bags 22 to the device providing the external fluid cooling.

Referring to the substrate 16, it will preferably be comprised of a carrier having a plurality of chips 26, such as those known in the industry as "C4" chips attached thereto. The substrate, with chip 26, constitutes a functional unit that has I/O at the peripheries disposed in a pattern compatible with the pins disposed in the inserts 14, to be described in greater detail with reference to FIGS. 7 and 8. The invention admits to a variety of substrate 16 packaging techniques, well known in the art.

Figure 3:
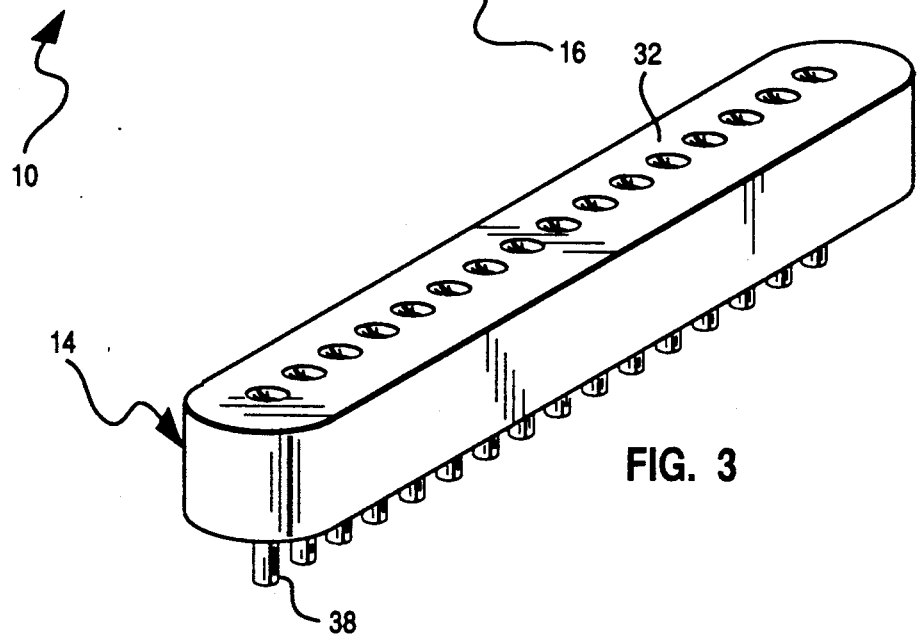
FIG. 3 is a pictorial view of one of the inserts of the package module of FIG. 1.
Figure 4:
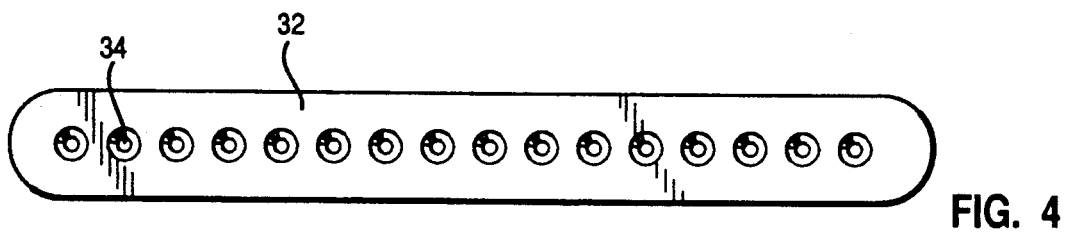
FIG. 4 is a top plan view of the insert of FIG. 3.
Figure 5:
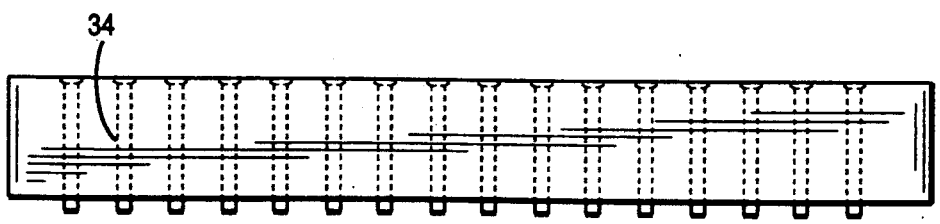
FIG. 5 is an elevational view of the insert of FIG. 3.

Referring now to FIG. 3, a pictorial view is provided of a typical insert 14 when separated from the frame 12. This insert 14 includes an insulated strip 32 having molded therein a plurality of conductive metallic pins 34 as shown in FIGS. 5-6. Arrangement of these pins may be more particularly understood with reference to FIGS. 4, 5 and 6 which are top and side views of the insert. The views of FIGS. 5 and 6 are sectional views of the insert 14 of FIG. 3.

Referring to FIG. 6 in more detail, it will be noted that each pin 34 preferably includes a pin extension 38 which, essentially, is a portion of the pin 34 extending downwards beyond the lowermost surface of the insert 14. The pins 34 are further fashioned within the insert 14 so as to be recessed below the upper surface of the insulated strip 32, thereby permitting formation of a cavity 36. Accordingly, the lowermost pin extension 38 and upper most portion of the pin 34 provide exposed surfaces, referred to herein as the lower pin contact point 39 and upper pin contact point 7, respectively. The cavities 36 may be preferably filled with a solder paste or conductive glue before attachment of a respective substrate 16 to form a package module 10 or packaging system of FIG. 9 in a manner to be described.

Referring now to FIG. 7, a sectional view of the module 10 of FIG. 1 is shown taken along line 7—7. Each fluid bag 22 will preferably include, on its lowermost surface, a metallic cover 30 facilitating desired heat transfer from the chip 26 to the fluid bag 22. In accordance with C4 technology in the aforementioned preferred substrate construction, each chip 26 is provided with a grid-like plurality of conductive balls 60 on the lower surface, which may effect desired electrical interconnection between internal portions of the chip 26 and desired locations on the substrate 16. The substrate 16 will include circuitized conductive lines leading out to I/O locations on the outer periphery of the substrate shown as locations 43 on the substrate 16 in FIG. 2. Each such I/O location 43 will have associated therewith one of the conductive metallic pins 34 extending through a respective insert 14.

Referring now to FIG. 8, an expanded view of a portion of FIG. 7 is shown therein where each pin 34 forms an electrically conductive joint with a corresponding I/O location 43 on the substrate 16. As hereinbefore indicated, in the preferred manner of forming the substrate 16, rather than forming vias through the substrate in a conventional manner, a plurality of dimples, such as the dimple 50 shown in FIG. 8, are formed in the substrate at each location where an I/O interconnection is desired to a conductive line on the substrate and to the chips 26 through balls 60. Most such dimples 50 are in electrical interconnection through the conductive balls 60 to respective portions of the chip and to respective pins 34. The substrate 16 will actually be comprised of a plurality of layers as desired on conductive and insulative material, such as those shown generically for illustrative purposes as substrate layers 42, 44, 46 and 48 in FIG. 8. Each dimple 50 will effect a downward protrusion of a substrate contact point 52, which will project into a correlative cavity 36, FIG. 6, associated with a respective pin 34. It will be recalled that the cavity will preferably have been filled with a conductive solder paste or glue 50, or the like, whereby a reliable electrical interconnection may be established between the upper pin contact point 37 of the pin 34, FIG. 6, and the substrate contact point 52 of the substrate 16, FIG. 8.

Referring back to FIG. 7, it is a feature of the invention to provide for a plurality of package modules 10 stacked in vertical registry wherein a plurality of vertical electrically conductive paths may be established through each such module in the Z axis and, further, wherein each of these vertical paths through the packaging system may, as desired, be routed horizontally through any of the individual package modules 10, so as to interconnect, for example, with any desired I/O location 43 associated with a given chip 26. Accordingly, as shown in FIG. 7, by stacking a plurality of these modules 10 in vertical registry with correlative pins of each module in vertical registry, this electrical interconnection between adjacent vertically aligned pins 34 may thus be effected.

Referring back to FIG. 8, this in turn means that with respect to a module vertically above the one shown in FIG. 8 (and not depicted), a lower pin contact point 39, FIG. 6, of a pin extending downwards from the upper module 10, which is not depicted, would thus extend into the upper surface of the dimple 50 to effect electrical interconnection therewith.

Referring now to FIG. 9, there is shown a packaging system of the present invention comprised of a plurality of the completed subassemblies of FIG. 2, which are stacked on top of one another. Additionally, a printed carrier 62 having any additional circuitization as desired is provided carrier 62 also preferably has these inserts 14 disposed therein at desired locations so as to vertically register with like inserts in the modules 10 and may further include means for mounting and electrically interconnecting to motherboards or the like. Screws 64 are provided extending through the holes 20 in the modules 10 and printed carrier 62 so as to both provide a reliable mechanical connection between the modules, and maintain the desired vertical electrical interconnection between vertically registered pins and dimples as previously described. In some applications it may further be desirable to provide a finned heat sink 66 for assisting in the conduction of thermal energy away from the assembled modules 10.

It will be seen from the foregoing that a highly flexible package is thereby provided, wherein varying circuit complexity can be accommodated for as desired by simply adding additional modules with no increase in mechanical complexity in effecting the desired X, Y and Z axis electrical interconnections. Moreover, due to the modular self-contained nature of each package module 10, thermal management is further automatically provided for, as well as the desired electrical interconnections. It is contemplated by the inventors that the ball 60 contacts and locations 43 are not necessarily to be limited to locations on the periphery of substrate 16. Thus, for example, the chips 26 could be arranged on substrate 16 in the form of a square, for example, in which case inserts 14 may be disposed between adjacent chips 26. Thus, whereas in the preferred embodiment depicted an elongate structure of each package module 10 is shown, it will be readily apparent to those of skill in the art that the invention is not intended to be so limited to any particular geometric configuration of the three-dimensional circuit package, and, thus, can vary according to the geometry of the substrate as desired.

We claim:

1. An electronic circuit package module comprising a discrete substrate carrying a plurality of integrated circuits interconnected to respective ones of a plurality of input-output locations defined on the outer periphery of said substrate; and frame means carrying said substrate having a plurality of conductive pins extending therethrough and defining exposed upper and lower contact points on opposing respective faces of said frame means, each said pin in contact with a respective one of said input-output locations.

2. The apparatus of claim 1 wherein said substrate defines a plurality of dimples each in electrical contact with a respective one of said lower contact points.

3. The apparatus of claim 2 further including fluid cooling unit means interconnected to said frame for conducting heat from said substrate.

4. The apparatus of claim 3 wherein said cooling unit means comprises a frame; and a plurality of fluid-filled bags each in contact with a respective one of said integrated circuits.

5. The apparatus of claim 4 wherein said frame means includes a plurality of inserts each carrying a plurality of said pins.

6. The apparatus of claim 5 wherein said frame means is disposed intermediately between said cooling frame and said substrate.

7. The apparatus of claim 6 wherein said frame means defines a recess and wherein said contact between said bags and said respective integrated circuit is established within said recess.

8. The apparatus of claim 7 wherein longitudinal axes of said pins are parallel.

9. An electronic circuit packaging system, comprising a plurality of electrically interconnected packaging modules, each comprising a discrete substrate carrying a plurality of integrated circuits interconnected to respective ones of a plurality of input-output locations defined on the outer periphery of said substrate; and a frame means carrying said substrate and having a plurality of conductive pins extending therethrough and defining exposed upper and lower contact points on opposing respective faces of said frame means, each said pin in contact with a respective one of said input-output locations.

10. The system of claim 9 wherein said modules are disposed in vertical registry with said pins of each said module establishing electrical interconnection with corresponding ones of said input-output locations on said substrate of an adjacent said module.

11. The system of claim 10 wherein each said substrate of said each modules defines a plurality of dimples each in electrical contact with a respective one of said contact points of an adjacent one of said modules.

12. The system of claim 11 wherein each of said modules further includes a fluid cooling unit means interconnected to said frame for conducting heat from said substrate.

13. The system of claim 12 wherein when said plurality of modules are disposed in said vertical registry, an upper surface of at least one of said modules abuts a lower surface of another, upwardly adjacent, one of said modules.

14. The system of claim 13 wherein when said modules are interconnected in said vertical registry, a plurality of conductive paths are established, each said path extending vertically through at least two said modules and, further, electrically interconnecting to respective substrates within each of said at least two modules.

15. The system of claim 14 further including a heat sink interconnected on top of said registered modules.

16. The system of claim 14 wherein, for each of said modules, said frame defines a recess; and said cooling unit means includes at least one fluid-filled bag in contact with a respective one of said integrated circuits within said recess.

* * * * *